United States Patent
Schlottig et al.

(10) Patent No.: US 10,551,132 B2
(45) Date of Patent: Feb. 4, 2020

(54) HEAT REMOVAL ELEMENT WITH THERMAL EXPANSION COEFFICIENT MISMATCH

(71) Applicant: International Business Machines Corporation, Armonk, NY (US)

(72) Inventors: Gerd Schlottig, Uitikon (CH); Gerhard I. Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 15/823,752

(22) Filed: Nov. 28, 2017

(65) Prior Publication Data
US 2019/0162484 A1 May 30, 2019

(51) Int. Cl.
*H01L 23/367* (2006.01)
*F28F 3/04* (2006.01)
*H01L 23/373* (2006.01)
*H01L 25/065* (2006.01)

(52) U.S. Cl.
CPC ............ *F28F 3/04* (2013.01); *H01L 23/3675* (2013.01); *H01L 23/3733* (2013.01); *F28F 2255/02* (2013.01); *H01L 25/0655* (2013.01); *H01L 2924/3511* (2013.01)

(58) Field of Classification Search
CPC .............. H01L 23/3733; H01L 23/3735; H01L 23/3736; H01L 23/3737; H01L 23/3738; H01L 2924/3511; H01L 23/473
USPC .......................... 361/699, 704; 165/80.4, 185
See application file for complete search history.

(56) References Cited

U.S. PATENT DOCUMENTS

| 7,319,591 B2 * | 1/2008 | Coffin ..................... H01L 23/34 257/E23.08 |
| 7,486,514 B2 | 2/2009 | Campbell et al. |
| 7,547,582 B2 | 6/2009 | Brunschwiler et al. |
| 7,875,972 B2 * | 1/2011 | Jadhav ................ H01L 23/3735 257/712 |
| 8,369,090 B2 | 2/2013 | Chester et al. |
| 8,736,048 B2 | 5/2014 | Schultz |
| 9,425,124 B2 | 8/2016 | Karidis et al. |

(Continued)

FOREIGN PATENT DOCUMENTS

WO    WO-2016159937 A1 * 10/2016 ........... B81B 7/0061

OTHER PUBLICATIONS

Schlottig et al., "Lid-Integral Cold-Plate Topology Integration, Performance, and Reliability," http://electronicpackaging.asmedigitalcollection.asme.org/article.aspx?articleid=2503789, pp. 1-8, 2016.

(Continued)

*Primary Examiner* — Allen J Flanigan
(74) *Attorney, Agent, or Firm* — Jay Wahlquist (57) ABSTRACT

A heat removal element comprises a deformable frame, having a first coefficient of thermal expansion. The frame includes a set of separate cavities formed in the frame, the set including a first cavity and a second cavity; and on one side of the first cavity, a deformable wall adapted to provide mechanical compliance with a heat source for transferring heat away from the heat source. The second cavity comprises a material that fills, at least partly, the second cavity, this material having a second coefficient of thermal expansion that differs from the first coefficient of thermal expansion.

20 Claims, 4 Drawing Sheets

(56) References Cited

U.S. PATENT DOCUMENTS

| | | | |
|---|---|---|---|
| 2003/0102553 A1* | 6/2003 | Ishikawa | H01L 23/3735 |
| | | | 257/707 |
| 2005/0253235 A1* | 11/2005 | Hara | H01L 23/3171 |
| | | | 257/678 |
| 2005/0280128 A1* | 12/2005 | Mok | H01L 23/427 |
| | | | 257/678 |
| 2008/0303021 A1* | 12/2008 | Coffin | H01L 23/34 |
| | | | 257/48 |
| 2011/0291258 A1* | 12/2011 | Murayama | F28F 7/00 |
| | | | 257/712 |
| 2016/0091260 A1 | 3/2016 | Schultz | |
| 2016/0290728 A1 | 10/2016 | Coteus et al. | |
| 2018/0350710 A1* | 12/2018 | Iwahashi | H01L 24/32 |

OTHER PUBLICATIONS

Wu et al., "Heat Design of Multi-Functional Structure of Electronic Equipment with Material Properties in Control System," http://www.scientific.net/AMR.625.159, Advanced Materials Research, ISSN: 1662-8985, vol. 625, pp. 159-166, doi:10.4028/www.scientific.net/AMR.625.159, © 2013 Trans Tech Publications, Switzerland.

\* cited by examiner

HEAT REMOVAL ELEMENT WITH THERMAL EXPANSION COEFFICIENT MISMATCH

BACKGROUND

In the electronics and computer industries, it is well known to employ various types of electronic device packages and integrated circuit chips and components, such as CPU, RAM and power components. Such electronic devices and components generate heat during operation, which heat should be removed to prevent adverse effects of overheating, which could destroy the devices and components or other components in their vicinity.

Large chips and multi-chip assemblies typically have a non-uniform height across their area. In addition, such chips may deform, in operation, according to different deformation profiles, such that the height profile may change, due to the temperature increase.

Cold plates are known, which adapt to non-uniform or warped shapes of chips or to shape-changing chip surfaces during operation. These cold plates typically rely on an external loading (force). This force is typically set ex-ante, i.e., before operating the chips. However, the precise shapes of the chips depend on the temperature, such that the thermal performance of such cold plates changes with the operating point of the chips.

SUMMARY

In one embodiment, a heat removal element is provided. The heat removal element comprises a deformable frame, which has a first coefficient of thermal expansion. The frame further includes a set of separate cavities, the latter formed in the frame. The cavities include at least a first cavity and a second cavity. On one side of the first cavity, the frame comprises a deformable wall adapted to provide mechanical compliance with a heat source for transferring heat away from that heat source, in operation. Furthermore, the second cavity comprises a material that fills, at least partly, the second cavity. This material has a second coefficient of thermal expansion that differs from the first coefficient of thermal expansion, to allow a thermal expansion coefficient mismatch. This, in turn, allow a given deformation profile of the deformable wall to be achieved, to more closely match a deformation profile of the heat source(s), in operation. As a result, the shape adaptation of the deformable wall can be improved.

According to another aspect, a system that comprises a heat source, as well as a heat removal element, such as described above, is provided. The deformable wall of the heat removal element is adapted to provide mechanical compliance with said heat source for transferring heat away from the heat source, in operation.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

The accompanying drawings show simplified representations of devices or parts thereof, as involved in embodiments. Technical features depicted in the drawings are not necessarily to scale. With the exception of FIG. 2, all the accompanying drawings depict heat removal elements in a non-deformed state. Similar or functionally similar elements in the figures have been allocated the same numeral references, unless otherwise indicated.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. The following detailed description is, therefore, not to be taken in a limiting sense.

In reference to FIGS. 1-10, an aspect which concerns a heat removal element 10, 10a-10f, also commonly referred to as a cold plate, is first described.

This element comprises a deformable frame 14, i.e., a structured receptacle or housing that, as a whole, exhibit a first coefficient of thermal expansion.

Figure 1:
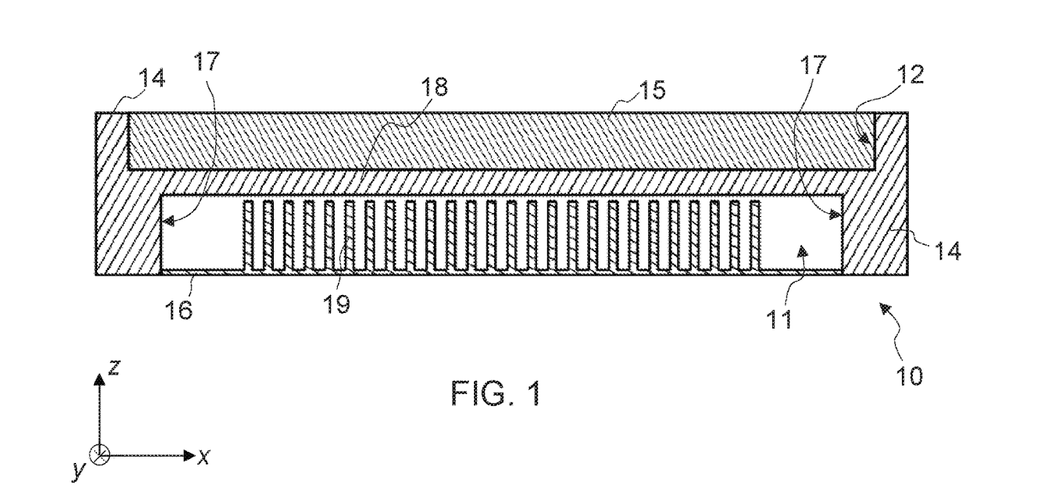
FIG. 1 is a 2D cross-sectional view of an example heat removal element, according to embodiments.
Figure 2:
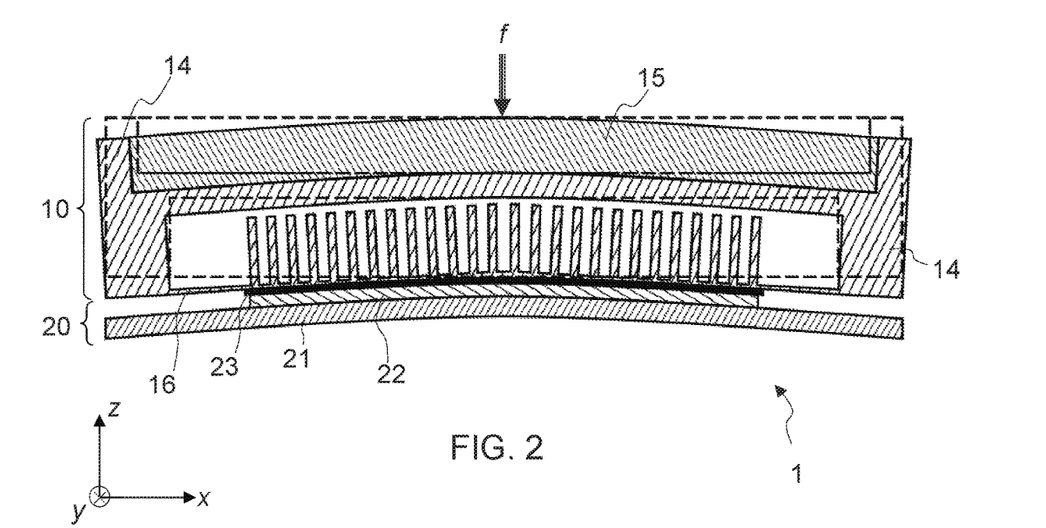
FIG. 2 shows a 2D cross-sectional view of a system including the heat removal element of FIG. 1, in contact with a heat source, according to embodiments.

The frame includes a set of separate cavities, which are formed within the frame 14. The cavities include at least a first cavity 11 and a second cavity 12, as illustrated in FIGS. 1, 2. In some embodiments, multiple second cavities are provided (also referred to as "additional" cavities herein), as depicted in FIGS. 3-10.

A deformable wall 16 is provided on one side of the first cavity 11. This wall 16 closes the first cavity 11. The deformable wall 16 is meant to mechanically contact one or more heat source components 22, which may have different heights, e.g., a single semiconductor chip or group of closely spaced semiconductor chips of more or less similar heights. Each of the heat source components may further deform according to a respective deformation profile, in operation, owing to the temperature increase.

In a system implementing such a heat removal element, the heat removal element is typically urged against the heat source(s). This way, the wall 16 of the frame 14 is adapted to provide mechanical compliance with a heat source 22 (see FIG. 2) for transferring heat away from that heat source 22, in operation. A loading mechanism can be used to that aim.

In some embodiments, the heat removal element is blocked on its upper side in the system, so as to favor downward deformations and achieve compliance.

The second cavity 12 comprises a material 15 that fills, at least partly, the second cavity 12. The filling material 15 has a second coefficient of thermal expansion that differs from the first coefficient of thermal expansion of the frame 14. This gives rise to a thermal expansion coefficient mismatch, which, in turn, allows a given deformation profile of the deformable wall to be achieved, to more closely match a deformation profile of the heat source(s), in operation. As a result, the shape adaptation of the deformable wall 16 of the frame 14 can be improved. In embodiments, the frame, the second cavity and the material that partially fills it, are altogether configured to impose a non-isotropic deformation of the deformable wall upon a temperature increase, owing to the different coefficients of thermal expansion of the frame and the filling material.

Note that the frame 14 as a whole is deformable. Beyond the lower, deformable wall 16, the frame 14 is deformable in order to accommodate the thermal expansion of the material filling the second cavity. For example, two or more portions of the frame may be deformable, these including the deformable wall 16, as well as one or more other portions of the frame that deform to accommodate the thermal expansion of the filling material.

In embodiments where the frame is made of two or more distinct materials (irrespective of the filling material 15), then the first coefficient of thermal expansion is regarded as an effective thermal expansion coefficient of the frame. In other embodiments, the frame is made of a single material (this excluding the filling material 15), e.g., copper or an alloy thereof, in which case the first coefficient of thermal expansion corresponds to the coefficient of thermal expansion of this single material. In all cases, the filling material 15 has a coefficient of thermal expansion that differs from the thermal expansion coefficient of the frame 14. For example, the filling material may have a coefficient of thermal expansion that differs from the thermal expansion coefficient of a portion of the frame in which the second cavity 12 is formed, to allow a coefficient mismatch and, thus, a desired deformation profile of the wall 16.

The present removal elements 10, 10a-10f have numerous advantages, as briefly discussed below. The deformable wall 16 allows a compliant cold plate to be achieved. The first cavity 11, which is closed by the deformable wall 16 provides movement space for that wall 16 to deform, in operation. Using such a compliant cold-plate, one or more heat sources 22 (such as a large chip or a multi-chip assembly) can be thermally attached with a thin and uniform bondline thickness throughout their full area, despite possible non-uniform heights across their area.

Figure 3:
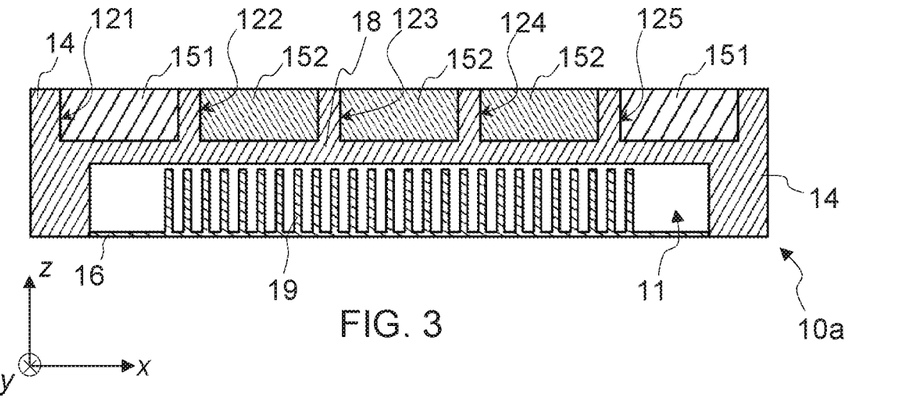
FIG. 3 is a 2D cross-sectional view of another example heat removal element, according to other embodiments.
Figure 4:
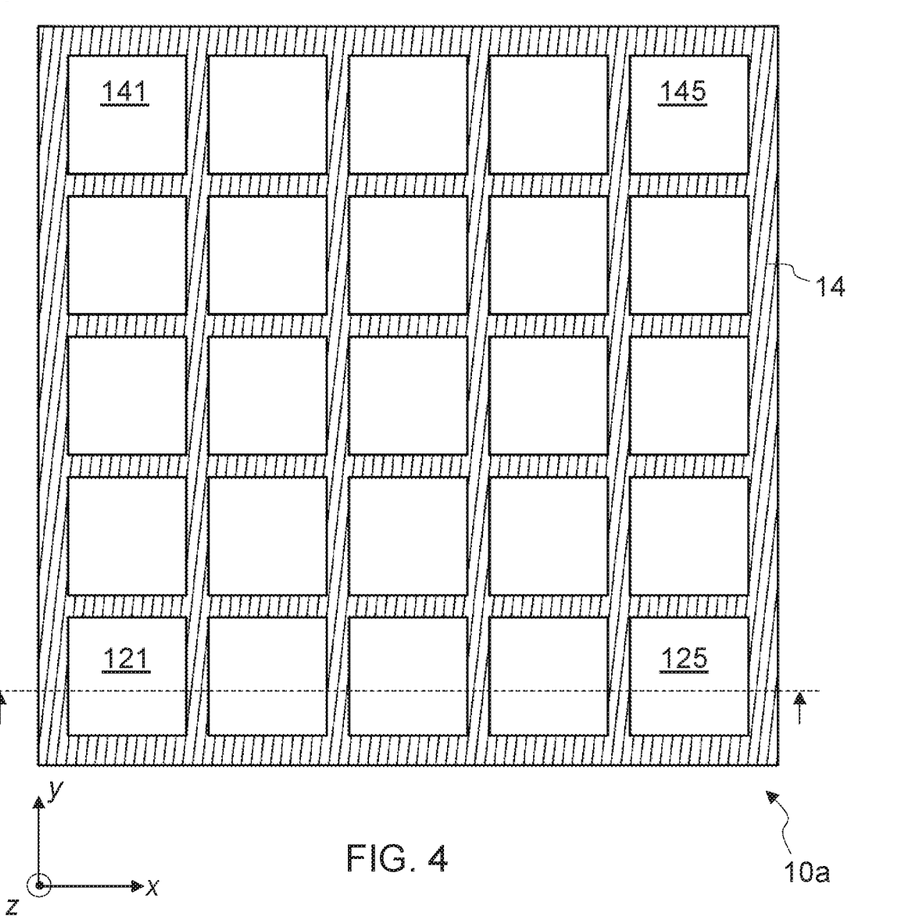
FIG. 4 is a top view of the example heat removal element of FIG. 3.

Now, and beyond the first cavity 11, one 12 or more 121-125 additional cavities are further provided, e.g., opposite to the first cavity 11 with respect to a second wall 18, opposite said deformable wall 16, as illustrated in FIGS. 1-3. Thus, the present heat removal elements 10, 10a-10f include at least two materials having different thermal expansions, thus driving a local expansion in at least one portion of the frame 14, upon a temperature change. Accordingly, the different coefficients of thermal expansion of the materials involved in the second cavity(ies) 12, 121-125 and the frame 14 can be exploited to improve the thermal contact with the heat sources 22 and, thus, improve the thermal efficiency of the heat removal.

As described herein, the heat removal element further comprises a heater in thermal communication with the filling material in some embodiments. Additionally, in some embodiments, the set of cavities comprises a plurality of second cavities. Each of the second cavities comprises a filling material having a coefficient of thermal expansion that differs from the first coefficient of thermal expansion of the frame. In some such embodiments, the frame, the plurality of second cavities and their respective filling materials are altogether configured to impose a deformation profile of the deformable wall upon a temperature increase, owing to the different coefficients of thermal expansion of the frame and the filling materials. This deformation profile is non-constant along one or more directions in-plane with the deformable wall. Some of the second cavities may for instance be filled, at least partly, with different filling materials, i.e., materials having distinct coefficients of thermal expansion. In addition, one or more of the second cavities may only be partly filled, in embodiments. The heat removal element is subject to a non-isotropic deformation, due to the temperature increase of the heat source, in operation. Dashed lines in FIG. 2 depict the heat removal element in its non-deformed state (e.g. as shown in FIG. 1).

In practice, as illustrated in FIG. 2, a system 1 that implements such a heat removal element 10 typically includes a mechanism designed to apply a force f onto the heat removal element. This way, the heat removal element 10 is urged against the heat source(s) 22. As noted above, the heat removal element may be configured in the system so as to urge deformations of the heat removal element against the heat source(s). In all cases, the deformable wall 16 is meant to be brought in physical contact with the heat source(s) 22. Now, while the actuation loading f of the cold plate causes the compliant element 16 to adapt to the shape of the contacted heat source(s) 22, the temperature change can be exploited to improve the shape adaptation of the wall 16, by leveraging the thermal expansion coefficient mismatch.

In particular, in embodiments as described below, the cold plate can be given an adaptive shape by suitably choosing the materials that fill the second cavity(ies) 12, 121-125. The additional shape adaptation obtained may be partly independent from the bulk material of the frame 15, the cooling cavity 11, and the external loading f.

In embodiments, an intermediate tape 23 (i.e., a polymer film) is used, as shown in FIG. 2. As the thickness of the intermediate tape 23 influences the temperature drop from the heat source to a coolant (inside the cavity 11), and thereby influences the maximum allowable power of the heat source for a given choice of inlet temperature (the thermal envelope of operating the chips), an improved shape adaptation and thus uniformity of the intermediate tape 23 can substantially reduce the described temperature drop and, therefore, improve the thermal envelope. This, in turn, may be exploited, to give rise to a thinner thermal interface and, thus, relaxed coolant inlet temperature specification and/or a reduced junction temperature. More generally though, one may use grease, an adhesive, or a pad, instead of an intermediate tape 23, or anything ensuring a good thermal contact.

As the activation force f can be reduced to achieve a sufficient thermal contact, the mechanical stress in the system reduces, and, as a result, the reliability of the system 1 comprising a heat removal element 10, 10a-10f as described herein can be improved. Using additional filling material(s) 15, 151-154 opens multiple ways of tailoring the shape adaptation of the cold plate as described herein. The thermal expansion mismatch can not only be exploited in operation of the system 1 but, in addition, during its fabrication (or assembly). Also, several filling materials in respective cavities can be combined and different geometries utilized, as discussed herein.

Compliant cold plates with additional cavities, as proposed herein, can for instance be used in a multitude of systems involving cold plates. In particular, the present elements 10, 10a-10f can, in embodiments, be used in applications such as computer hardware, electronics (including high-powered electronics), power drives, lasers, medical equipment and aerospace, for example.

One example advantage is that the present elements 10, 10a-10f allow, in embodiments, fewer assembly steps, as they do not require a second thermal interface material (also commonly called TIM2 in the art) to make contact with the cold plate. Similarly, no lid nor capping is required.

Example embodiments of the present heat removal elements 10, 10a-10f are now described in detail.

To start with, in some embodiments, the present heat removal elements 10, 10a-10f involve an array of fins 19, provided in the first cavity 11. Additionally, in some embodiments, no fins are provided in the additional cavities 12, 121-125 as the latter are filled (at least partly) with a material. Yet, in other embodiments, the material(s) filling the additional cavities may be structured, to further tune the desired deformation profile for the wall 16. The fins 19 may for instance extend, inside the first cavity 11, from the deformable wall 16, as assumed in the accompanying drawings. Internal fins 19 increases the surface area for heat transfer and create turbulences, which in turn reduces the thermal resistance of the element.

In elements 10, 10a-10f as described in embodiments herein, the frame 14, the second cavity 12 and the material 15 that partially fills it, are altogether configured to impose a non-isotropic deformation of the deformable wall 16 upon a temperature increase, as illustrated in FIG. 2. A complex deformation profile can be achieved, so as to match a given deformation profile of the heat source(s). This way, specific directions of deformation can be obtained to improve the thermal contact the heat source(s), as illustrated in FIG. 2. As is to be understood, the deformation depicted in FIG. 2 is exaggerated, for purposes of explanation.

In order to achieve specific directions of deformation, the second cavity(ies) 12, 121-125 have a form factor. When several additional cavities are relied on, such cavities may further have different form factors. Such form factors help in achieving specific directions of deformation. For example, a single, essentially planar cavity 12 can be provided, as shown in FIG. 1. In this example, the material 15 filling the cavity 12 induces a lateral expansion that causes the element 10 to bend (so does the flexible wall 16), as depicted in FIG. 2. The frame 14 bends, in order to accommodate for the overexpansion of element 15, hence leading to a concave deformation of the frame 14. This, in turn, allows a better shape adaptation to a convex deformation of the heat source 22, as illustrated in FIG. 2. More generally, concave or convex deformations of the wall 16 can be achieved, depending on the thermal expansion coefficient mismatch between, on the one hand, the filling material(s) 15 and, on the other hand, the frame 14. Even more generally, more sophisticated deformation profiles can be achieved, by using several additional cavities and/or by structuring the additional cavity(ies), as discussed later.

In the example of FIGS. 1 and 2, the heat removal element 10 comprises a single additional cavity 12 that extends opposite to the deformable wall 16 with respect to the first cavity 11 and parallel to the first cavity 11. The form factor of the cavity 12 makes it possible to achieve the desired deformation.

In other embodiments, a set of separate, additional cavities 121-145 are involved. For example, outer cavities 121e,125e; 121f, 125f, can be structured so as to extend laterally along the first cavity 11, to accentuate peripheral deformations of the element 10e, 10f, as illustrated in FIGS. 9 and 10.

Figure 9:
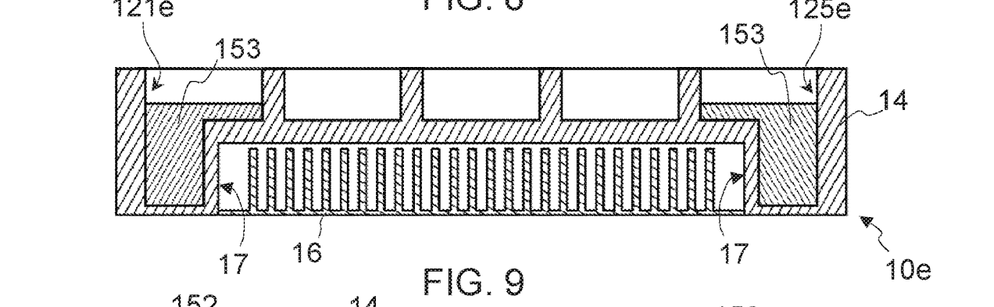
Figure 10:
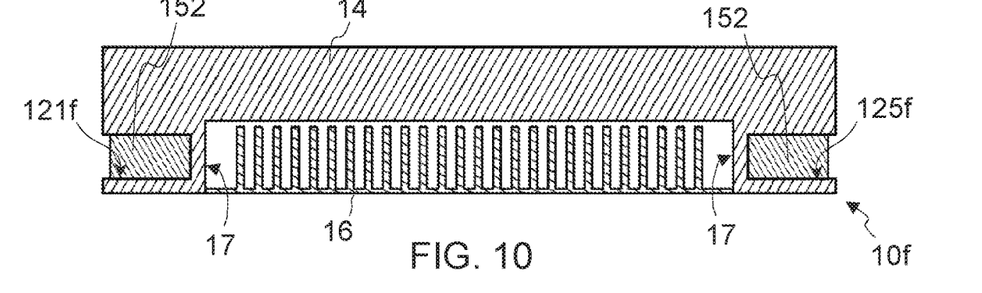

In the example of FIG. 9, the outer cavities 121e, 125e have an inverted L profile, whereas in the example of FIG. 10, the outer cavities 121f, 125f are profiled as a rectangular bar that merely extends along lateral walls 17 of the first cavity 11.

In other variants, a single structured cavity is used, wherein structures in the cavity allow the deformation amplitude of the frame 14 (and the wall 16) to be locally tuned.

Figure 6:
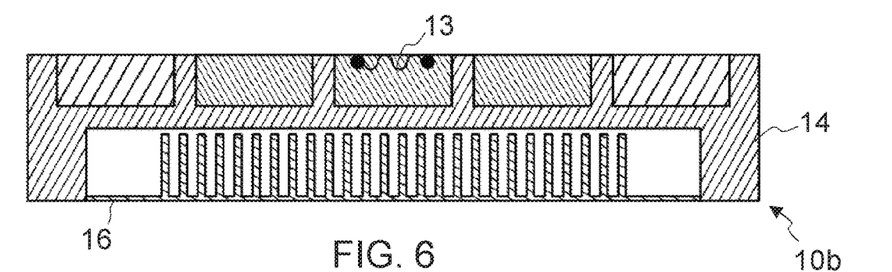
FIGS. 6-10 are 2D cross-sectional views of heat removal elements according to other embodiments.

If some embodiments, the heat removal element 10b further comprises a heater 13, as illustrated in FIG. 6. The heater is in thermal communication with the material filling one of the upper cavities in the example of FIG. 6. More generally though, one or more heaters may be provided, so as to provide additional control on the local temperature of the filling material(s) and the thermal expansion coefficient mismatches. This way, improved local control of the expansion of the filling material(s) can be achieved, a thing that may be exploited in operation of the system 1, as well as during its fabrication.

Referring to FIGS. 3-10, various embodiments are now described in detail, which involve a plurality of additional cavities 121-145. In some embodiments, each of these cavities 121-145 is filled (at least partly) with a filling material 151-154. The materials filling the cavities 121-145 have, each, a coefficient of thermal expansion that differs from the thermal expansion coefficient of the frame 14, to allow a coefficient mismatch, consistently with a principles discussed herein. Additionally, in some embodiments, some of the cavities are not be filled with a solid-state material (i.e., they may instead be filled with air or another gas). In all cases, having several additional cavities makes it simpler to tailor preferred directions of deformation for the thermal interface wall 16.

As noted earlier, the frame 14, the plurality of second cavities 121-125 and their filling materials 151-154 may altogether be configured to impose a complex deformation profile of the deformable wall 16 upon a temperature increase, owing to the coefficient mismatches. This deformation profile is non-constant along one direction (e.g., x or y) or more directions (e.g., x and y), i.e., directions that are in-plane with the deformable wall 16, which extends parallel to plane (x, y) in the orientation assumed in the accompanying drawings.

The more additional cavities, the more complex the deformation profile achieved. In practice, the complexity of the deformation profile of the wall 16 depends on the expected deformation profile of the heat source(s), it being noted that the two deformation profiles should ideally be as complementary as possible (e.g., a concave deformation of the wall 16 best match a correspondingly convex deformation of the heat source underneath). In some embodiments, only two additional cavities are included, as suggested by the example of FIG. 10, where the cavities extend laterally along the first cavity 11. However, one-dimensional arrays of cavities may be provided on each lateral side of the first cavity 11, in other embodiments.

A 2D array of upper cavities is relied on, in some embodiments, which makes it easier to fabricate, as explained below. For example, an array of 25 additional cavities 121-145 may be involved, as in the example of FIG. 4, which is a top view of the device of FIG. 3 (FIG. 3 is a cross-sectional view across the cutting plane shown by the dashed line in FIG. 4). More generally, this array may include any number of cavities, such as, for example, between 2 and 64 upper cavities. For example, in some embodiments, only two cavities are used in a rotation-symmetric arrangement, wherein two different filling materials are used.

Different strategies can be used to tailor the deformation profile of the deformable wall 16. For example, the heat removal elements 10a-10d shown in FIGS. 3-8 involve different filling materials 151-154. I.e., two or more of the additional cavities 121-125 can be filled (along a given in-plane direction of the 2D array of upper cavities), at least partly, with materials having distinct coefficients of thermal expansion (CTEs). Still, each of these materials has a thermal expansion coefficient that differs from the coefficient of thermal expansion of the frame 14.

Figure 8:
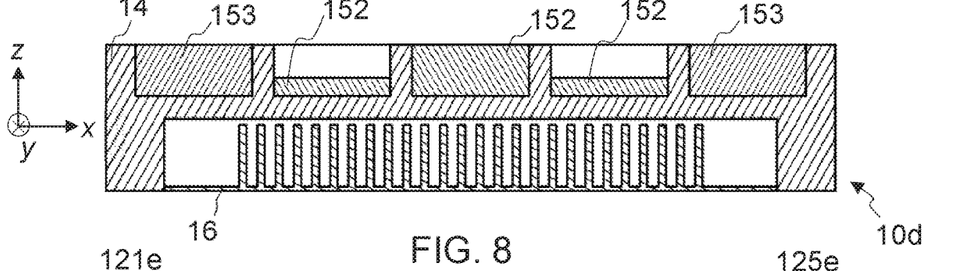

In the examples of FIGS. 8, 9, the heat removal elements 10d, 10e involve additional cavities that are only partly filled. More generally, only one of the upper cavities may be partly filled, in some embodiments. In addition, in some embodiments, some of the cavities are not filled at all (e.g., filled with air), as in the example of FIG. 9.

In embodiments such as depicted in FIGS. 3-9, the set of additional cavities 121-145 includes at least a subset of cavities that are provided, each in an upper portion of the frame 14. That is, each cavity of this subset extends opposite to the deformable wall 16, with respect to the first cavity 11 (i.e., with respect to the intermediate wall 18 of the frame) and parallel to the first cavity 11. As one may realize, this eases the fabrication process as upper cavities can be all opened from a same side of the frame 14.

The deformable wall 16 is configured to provide mechanical compliance with a heat source on one side of the frame 14 (i.e., on the lower side in the accompanying drawings). Thus, and as depicted in FIGS. 3-9, at least a subset (or all in some embodiments) of the additional cavities are, each opened on the opposite side of the frame 14, i.e., opposite to said one side. This further eases the fabrication, inasmuch as such cavities merely need be opened from the top of the frame 14 in that case, as illustrated on FIGS. 5A-5C. Yet, such cavities can be left open on top and no additional layer or lid is required on top of the frame 14, which simplifies the fabrication.

Figure 5A:
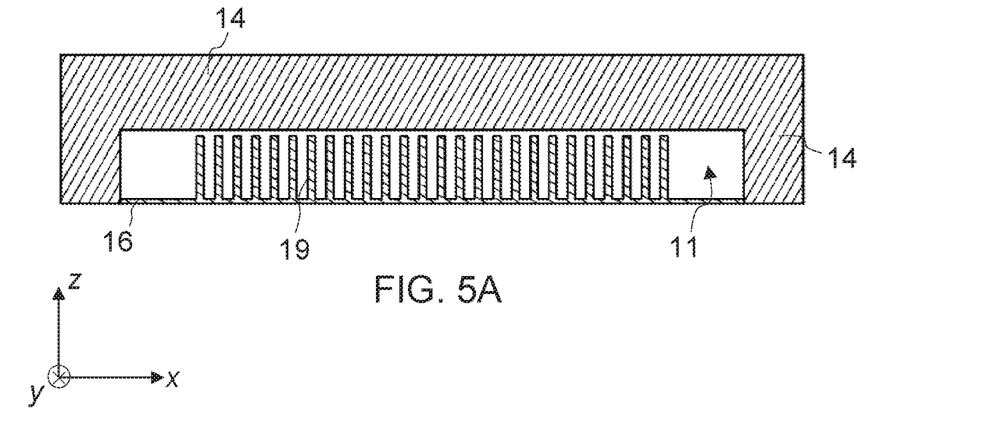
FIGS. 5A-5C shows 2D cross-sectional views illustrating fabrication steps of the heat removal element of FIGS. 3 and 4.
Figure 5B:
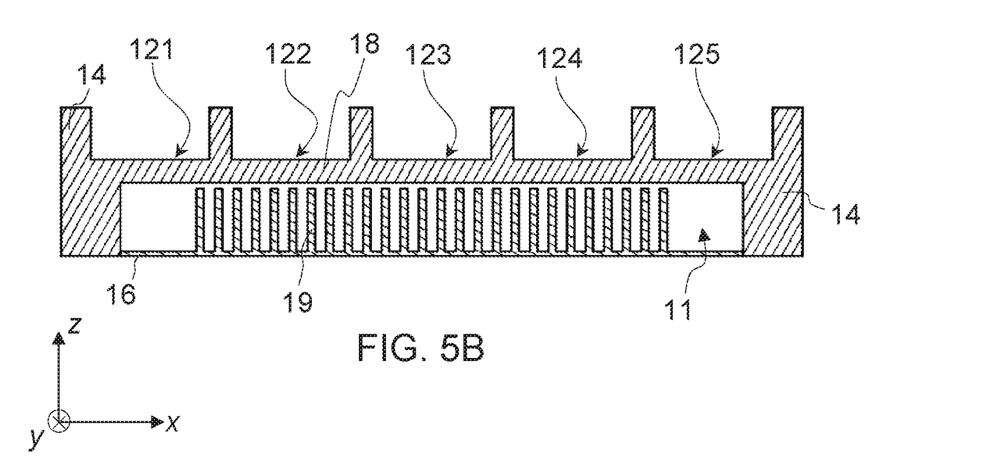
Figure 5C:
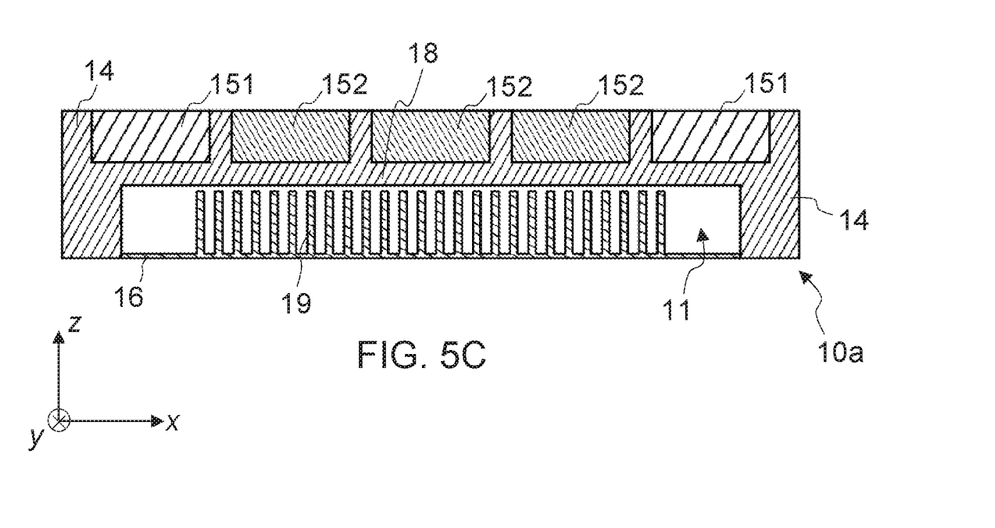

FIGS. 5A-5C depict high-level steps of preferred fabrication methods. In such methods, a frame is initially provided (FIG. 5A), which include a first cavity 11, enclosed by a deformable wall 16, from which an array of fins 19 extends within the cavity 11. The upper portion of the frame 14 is structured in a subsequent processing step, FIG. 5B. The upper portion can notably be structured using a milling process, or by electro-eroding this portion, or attaching it by soldering or brazing, or, still, by creating it by a lamination process. Finally, the upper cavities 121-125 formed in FIG. 5B are filled with a material 151, 152, as seen in FIG. 5C. Different materials 151, 152 can be used in some embodiments. In some embodiments, the upper cavities are only partly filled, as in FIG. 8.

Also, such cavities can have different depths, in some embodiments, as depicted in FIG. 9, which allows the deformation profile of the wall 16 to be further tailored.

Figure 7:
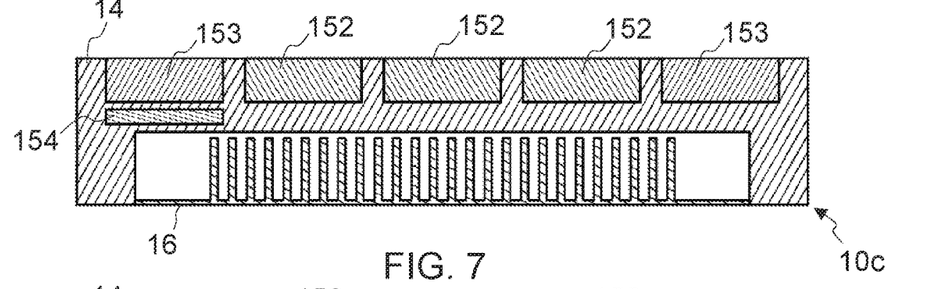

Although upper cavities are used in some embodiments, to ease the fabrication process, in other embodiments, one or more additional cavities are buried in the frame. In that case, the frame is typically multilayered, to ease the fabrication of the buried cavities. In addition, the additional cavities may be asymmetrically arranged, as illustrated in FIG. 7, where a buried cavity is arranged below the upper-left cavity. If addition, the buried cavity can be filled with a material 154 that is distinct from the materials 152, 153 used to fill the upper cavities, in some embodiments, as further depicted in FIG. 7. This way, a more efficient use of the thermal expansion of the filling material as well as an asymmetric deformation profile can be achieved.

Referring now to the embodiments of FIGS. 9 and 10, the heat removal elements 10e, 10f here include additional cavities 121e, 125e; 121f, 125f that extend, each, parallel to a lateral wall 17 of the first cavity 11 (this lateral wall 17 is perpendicular to the deformable wall 16 in this example), as evoked earlier.

In the case of FIG. 9, outer cavities 121e, 125e are opened from the top, just like the central cavities (not filled in this example). Yet, an outer portion of each of the outer cavities 121e, 125e extends deeper in the frame, outside the area of the first cavity 11, so as to be in vis-à-vis with a lateral wall 17 of the first cavity 11.

In the example of FIG. 10, only two additional cavities 121f, 125f are visible, which are opened from lateral sides of the frame 14 and filled with a same material 152, hence allowing a concave or convex deformation profile to be achieved. Whether a concave or convex deformation profile is obtained depends on the thermal expansion mismatch, as noted earlier. In some embodiments, 1D arrays of outer cavities are provided laterally to the first cavity 11, as noted earlier.

In each of the examples of FIGS. 3-6, and 8-10, the additional cavities are opened from a peripheral edge surface of the frame 14, which eases the fabrication process. In the example of FIG. 7, a subset of the cavities are buried in the frame, which requires additional processing.

As also noted earlier, the heat removal elements described herein can further involve one or more heaters 13, as shown in for example in FIG. 6, each in thermal communication with one or more of the materials that fill the additional cavities 121-145. Compliant cold plates with additional cavities and heaters allow further shape adaptation of the deformable wall 16 during the operation of the system.

FIG. 6 shows an example of a heat removal element 10b, wherein a heater extends across a material that fills one of the additional cavities. In other embodiments, several heaters are included, which may possibly allow the filling materials to be heated to different temperatures. Such heaters are typically formed, each, as a resistive heating element, connected by an electrical circuit. A heater can for instance be shaped as a serpentine extending across a filling material, as depicted in FIG. 6.

In other embodiments, thermal paths are provided across the frame (along direction z), between the heat source 22 and the heaters, so as to leverage heat produced by the heat source 22 and heat the filling materials 151-154. Furthermore, alternative to resistive heaters, additional heat sources may be involved. For example, the system may integrate one or more light sources, configured to hit the filling materials, to achieve a desired working temperature and, thus, a desired local deformation.

The heat removal elements 10, 10a-10f described herein involve a frame 14 that comprises copper and/or a copper alloy. In some embodiments, aluminum or steel can be used. The frame of the heat removal elements can further comprise SiC. The filling material(s) 15, 151-154 may for instance comprise $SiO_2$, SiC, and/or an amorphous material (e.g., a polymer). In the latter case, the amorphous material has a glass-transition temperature that is between 25° C. and 95° C., in some embodiments, so as to leverage deformations induced by the working temperatures of a chip. In some embodiments, reinforced or unfilled thermosetting and thermosoftening polymers can be used, for examples acrylic resins, epoxies, but also polyphenylene sulfide polymers. Additionally, any polymer can be used, e.g., including polymers which have a crystalline structure below their glass transition temperature.

$SiO_2$ and SiC particles can, for instance, be used as filler materials. For example, SiC particles can be used to reinforce a polymer (SiC particles may, e.g., be directly filled and then immobilized using a polymer). The examples of materials given above typically provide suitable thermal expansion coefficient mismatches in practice.

In some embodiments, the thermal coefficient mismatch is at least of 10 (or even 15) ppm/K, driving over a temperature difference of 200 K. A larger difference for lower temperature differences may be desirable, especially where an integrated heater is used. Yet, a smaller coefficient mismatch may be sufficient for more temperature lift (e.g., metal alloys can stand some more than 450 K).

In scenarios where the filling material expands/contracts less than the cold plate, e.g., $SiO_2$ (CTE=3 ppm/K) vs. Cu (CTE=17 ppm/K), the CTE mismatch can be limited. In such cases, carefully designed temperature lifts and geometries are needed.

For example, for purposes of explanation, in one example environment, it is desired to induce a concave ("⋒") deformation of a frame made of copper, while the expected frame temperature is of 45° C. If the curing temperature of the filler is 150° C., one has to cool down by 105° C. Now, looking at the contraction of the two materials involved, if the filler contracts more than the copper (as filled polymers would typically do), one obtains a convex ("⋓") deformation of the copper frame instead. In such an example case, embodiments can implement at least one of the following:

Cure at lower temperatures than the operation temperature;

Use a geometry where the stronger contraction creates a concave deformation (not above the cavity 11); and/or Use a filler that contracts less than copper.

More generally, there is often a trade-off between the complexity of the frame geometry (this including the arrangement of the second cavities) and the materials used to fill the second cavities. For example, a simple structure as shown in FIG. 1 typically requires a complex filling material (e.g., a mere epoxy may not allow desired concave deformations to be reached when using a copper frame). On the contrary, a more complex structure such as shown in FIG. 9 or 10 makes it possible for a simpler filling material (e.g., epoxy) to yield a desired concave deformation of the frame, in operation.

In terms of dimensions, the lower interface wall 16 thickness (along axis z), in some embodiments, is between 50 µm and 2 mm. In some such embodiments, the lower wall 16 thickness is between 150 µm and 1.2 mm thick. The total width (along axis x) of the frame is between 50 and 80 mm for single die heat source packages, in some embodiments. The typical frame width (at the periphery, along x) is between 2-10 mm, in some embodiments. Fin heights (along axis z) are approximately at least 200 µm, in some embodiments. In some embodiments, the fin heights are one or more millimeters. The specific dimensions of the cavities depend on the application and the problem to solve. The additional (second) cavities, which are typically filled with a filler polymer, can for instance be more than 2 mm thick (along axis z), depending on the thickness of the intermediate wall separating the cavities 11 and 12. The thicker and more spread out these features are, the more deformation they drive.

As further noted earlier, the present devices and systems can rely on a gaseous or liquid coolant circulated in the cavity 11. The latter can, thus, comprise a coolant inlet and outlet (not shown), to allow a coolant to be circulated within the cavity 11.

According to another aspect, a heat removal element as described herein can be embodied in a system 1, which further includes one or more heat sources 22, as depicted in FIG. 2, in addition to a heat removal element 10, 10a-10f such as described earlier.

Aspects of such systems are described above in reference to the heat removal elements. Such aspects are only briefly recalled here. The deformable wall 16 of the frame 14 is adapted to provide mechanical compliance with the heat source(s) 22, so as to be able to transfer heat away from such heat source(s) 22, in operation. As further discussed earlier, the one or more additional cavities 121-145 of the frame each comprise a material that fills, at least partly, its associated cavity. In addition, the filling materials have coefficients of thermal expansion that each differ from the thermal expansion coefficient of the frame 14, consistently with the above.

In practice, such a system 1 typically includes a mechanism f urging the heat removal element 10, 10a-10f against the heat source 22. This way, the deformable wall 16 is in physical contact with the heat source(s) 22. Yet, in some embodiment, only the deformations of the frame 14 are urged against the heat source(s), as noted earlier.

As shown in FIG. 2, the system 1, for instance, comprises a semiconductor module 20 that includes a heat source 22. The module 20 typically comprises a substrate 21, where the heat source 22 is arranged on one side of the substrate 21.

The heat source(s) 22 can be formed by a single semiconductor chip or a group of semiconductor chips (not shown), which can have slightly different heights or different deformation profiles, in operation. In some embodiments, an intermediate tape 23 is used to ensure good thermal contact between the heat source(s) and the lower wall 16 of the heat removal element, as depicted in FIG. 2.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly cited above may be contemplated, which allow a thermal expansion coefficient mismatch to be achieved, consistently with principles underlying this invention.

What is claimed is:
1. A heat removal element comprising:
a deformable frame, having a first coefficient of thermal expansion, the frame including:
a set of separate cavities formed in the frame, the set including a first cavity and a second cavity; and on one side of the first cavity, a deformable wall adapted to provide mechanical compliance with a heat source for transferring heat away from the heat source;

wherein the second cavity comprises a material that fills, at least partly, the second cavity, this material having a second coefficient of thermal expansion that differs from the first coefficient of thermal expansion.

2. The heat removal element according to claim 1, wherein the frame, the second cavity and the material in the second cavity, are together configured to impose a non-isotropic deformation of the deformable wall upon a temperature increase based on the different first and second coefficients of thermal expansion.

3. The heat removal element according to claim 2, wherein the second cavity has a form factor.

4. The heat removal element according to claim 2, wherein the second cavity extends opposite to the deformable wall, with respect to the first cavity, and parallel to the to the first cavity.

5. The heat removal element according to claim 2, wherein the heat removal element further comprises a heater in thermal communication with the filling material.

6. The heat removal element according to claim 2, wherein the frame comprises one or more of copper and a copper alloy.

7. The heat removal element according to claim 6, wherein the filling material comprises one or more of $SiO_2$ and SiC.

8. The heat removal element according to claim 6, wherein the filling material is an amorphous material that has a glass-transition temperature between 25° C. and 95° C.

9. The heat removal element according to claim 2, wherein the set of cavities comprises a plurality of second cavities, each comprising a filling material having a coefficient of thermal expansion that differs from the first coefficient of thermal expansion of the frame.

10. The heat removal element according to claim 9, wherein the frame, the plurality of second cavities and their respective filling materials are altogether configured to impose a deformation profile of the deformable wall upon a temperature increase based on the respective different coefficients of thermal expansion of the frame and the filling materials, said deformation profile being non-constant along one or more directions in-plane with the deformable wall.

11. The heat removal element according to claim 9, wherein at least two of the second cavities are filled, at least partly, with different filling materials having distinct coefficients of thermal expansion, wherein each of the distinct coefficients further differ from the first coefficient of thermal expansion.

12. The heat removal element according to claim 9, wherein at least one of the second cavities is only partly filled.

13. The heat removal element according to claim 9, wherein at least a subset of the second cavities each extend opposite to the deformable wall, with respect to the first cavity, and parallel to the first cavity.

14. The heat removal element according to claim 13, wherein said deformable wall is configured to provide mechanical compliance with said heat source on one side of the frame and said subset of the second cavities are each open on another side of the frame, opposite to said one side.

15. The heat removal element according to claim 9, wherein one or more of the second cavities each extend parallel to a lateral wall of the first cavity, the lateral wall perpendicular to the deformable wall.

16. The heat removal element according to claim 9, wherein the heat removal element further comprises one or more heaters, each in thermal communication with one or more of the materials that fill the second cavities.

17. The heat removal element according to claim 1, wherein the first cavity further comprises an array of fins.

18. The heat removal element according to claim 17, wherein each fin in the array of fins extends inside the first cavity from the deformable wall.

19. A system including:
a heat source; and
a heat removal element, the heat removal element comprising:
a deformable frame, having a first coefficient of thermal expansion, the frame including:
a set of separate cavities formed in the frame, the set including a first cavity and a second cavity; and
on one side of the first cavity, a deformable wall adapted to provide mechanical compliance with said heat source for transferring heat away from the heat source;
wherein the second cavity comprises a material that fills, at least partly, the second cavity, the filling material having a second coefficient of thermal expansion that differs from the first coefficient of thermal expansion of the frame.

20. The system according to claim 19, further comprising a mechanism urging the heat removal element against the heat source such that the deformable wall is in physical contact with the heat source.

* * * * *